United States Patent [19]

Spiesman

[11] Patent Number: 4,598,212
[45] Date of Patent: Jul. 1, 1986

[54] DRIVER CIRCUIT

[75] Inventor: Robert L. Spiesman, Phoenix, Ariz.

[73] Assignee: Honeywell, Inc., Phoenix, Ariz.

[21] Appl. No.: 682,522

[22] Filed: Dec. 17, 1984

[51] Int. Cl.[4] .............................................. H02J 3/02
[52] U.S. Cl. ........................................ 307/3; 307/105;
307/149; 330/105; 330/79
[58] Field of Search ..................... 307/1, 3, 5, 7, 103,
307/105, 149, 490, 491, 494; 330/75, 79, 109,
157, 165, 166, 167, 195, 196, 105, 260, 97

[56] References Cited

U.S. PATENT DOCUMENTS

| | | | |
|---|---|---|---|
| 2,215,777 | 9/1940 | Benz | 330/105 X |
| 2,542,087 | 2/1951 | Kreithen | 330/79 |
| 2,719,191 | 9/1955 | Hermes | 330/105 X |
| 2,751,442 | 6/1956 | Ketchledge | 330/105 X |
| 2,827,576 | 3/1958 | Wohlers | 307/149 |
| 3,030,022 | 4/1962 | Gittleman | 330/75 X |
| 3,043,965 | 7/1962 | Scarbrough et al. | 330/79 X |
| 3,134,080 | 5/1964 | Story | 330/105 X |
| 3,341,786 | 9/1967 | Stull | 330/79 X |
| 3,368,159 | 2/1968 | Richman | 330/79 X |
| 3,445,781 | 5/1969 | Wolcott | 330/195 X |
| 3,564,441 | 2/1971 | Eide | 330/109 X |
| 3,577,179 | 5/1971 | West | 330/109 X |
| 3,648,188 | 3/1972 | Ratcliff | 330/196 X |
| 3,684,975 | 8/1972 | Valfre | 330/196 X |
| 3,820,036 | 6/1974 | Akiyama | 330/109 X |
| 4,105,941 | 8/1978 | Routh | 330/167 X |
| 4,156,859 | 5/1979 | Forward et al. | 307/490 X |
| 4,175,465 | 11/1979 | Schmoll | 307/494 X |
| 4,253,070 | 2/1981 | Carlsen, II | 330/79 X |
| 4,453,131 | 6/1984 | Paullus | 330/196 X |

Primary Examiner—William M. Shoop, Jr.
Assistant Examiner—Shik Luen Paul Ip
Attorney, Agent, or Firm—A. A. Sapelli; J. S. Solakian; A. Medved

[57] ABSTRACT

A driver circuit for applying a first signal having a desired wave form, frequency and peak to peak voltage to a coaxial transmission line which also has applied to it a second signal having a substantially higher frequency. An operational amplifier has the first signal applied to its noninverting input terminal. The output of the operational amplifier is applied across the primary winding of a driver coupling transformer through an inductor which provides high impedance to the second signal. The voltages induced in the secondary winding of the driver transformer are applied to the transmission line. The primary winding of a feedback transformer is connected in parallel with the secondary winding of the driver transformer. The voltage induced in the secondary winding in the feedback transformer are applied by a feedback circuit including an R.C. filter to the inverting input terminal of the operational amplifier. The signal applied to the inverting input terminal includes both an A.C. component and a D.C. component, which components cause the output current of the operational amplifier to induce in the secondary winding of the driver transformer a signal, the wave form, frequency and peak to peak voltage of which substantially equal those of the first signal applied to the noninverting input terminal of the operational amplifier.

5 Claims, 2 Drawing Figures

DRIVER CIRCUIT

BACKGROUND OF THE INVENTION

1. Field of the Invention

This invention is in the field of driver circuits for applying to a transmission line, the loading of which varies, a signal having a desired wave form, frequency, and peak to peak voltage.

2. Description of the Prior Art

The use of coupling transformers to permit a driver circuit to apply signals to a transmission line is known in the art. However, applicant is unaware of any prior art driver circuits which are capable of applying through a coupling transformer, signals on which strict limits are placed as to the wave form, peak to peak voltage, and frequency of the signal as applied to the transmission line.

The problem solved by the driver circuit of this invention is how to apply a relatively low frequency signal carrying binary coded information onto a transmission line which is simultaneously, or concurrently, carrying significantly higher frequency digital signals, without there being a conflict between the two signals.

The environment in which this invention is used is a token passing local area network in which a limited, but significant number of physical modules, the number of which can change from time to time, communicate with one another over the local control network, transmission line, bus, or coaxial cable. The communication between physical modules is at a frequency of 5.0 MHz in the preferred embodiment. The peak to peak voltage of the higher frequency signals is limited in the preferred embodiment to 800 MV. In this environment one physical module is permitted, or enabled, to transmit timing information over one of the coaxial cables of the local network bus. The timing information is included in a timing frame prepared by the timing subsystem of the physcial modules so enabled. The timing frame includes information which permits timing subsystems of all physical modules of the network to synchronize themselves with that of the transmitter. When a redundant cable is used, a second module may be enabled to transmit timing frames over the second cable at a lower frequency 12.5 K Hz in the preferred embodiment. A physical module which is capable of transmitting timing frames over the local control network cable is provided with driving circuit of this invention. For additional information on this environment, reference is made to concurrently filed patent application entitled Method and Apparatus for Synchronizing the Timing Subsystems of the Physical Modules of a Local Area Network by David L. Kirk, application Ser. No. 06/682,645 filed Dec. 17, 1984, which is assigned to Honeywell Inc., the assignee of this application. This disclosure of the above identified Kirk application is hereby incorporated by reference into this application.

The peak to peak voltage of the lower frequency signals applied to the cable or transmission line, has to be such that when it is added to the peak to peak voltage of the higher frequency signals, the sum of the two voltages is such as not to overdrive the receivers of the physical modules of the network. Controlling the peak to peak voltage is made more difficult because the load seen by the driver circuit is not necessarily constant. The wave form of the applied signal should not include harmonics of the higher frequency signals. If such harmonics were present, they could result in errors in the information transmitted at the higher frequency. In addition, the driver circuit has to provide high impedance to the higher frequency signals which are also carried by the cable to prevent overloading the driver circuit supplying the higher frequency signals.

SUMMARY OF THE INVENTION

The present invention provides a driver circuit which applies through the secondary winding of a driver coupling transformer a quasi-sinusoidal timing signal having a given peak to peak voltage and frequency to a coaxial cable. The operational amplifier of the driver circuit has inverting and noninverting inputs and produces an output which is applied through an inductance and which is capacitively coupled across the primary winding of the driver transformer. The inductance provides a high impedance to the high frequency signals present on the coaxial cable, but its impedance to the lower frequency timing signals is not significant. Signals applied to the driver circuit are a bipolar substantially square wave signal of a given frequency. The bipolar squarewave signal is filtered to remove higher frequency components, or harmonics and attentuated by an input circuit to apply a signal having the desired wave form, peak to peak voltage and frequency, to the noninverting input of the operational amplifier. The output of the operational amplifier is connected through the inductance and a D.C. feedback resistor to the inverting input of the operational amplifier. This circuit constitutes the D.C. feedback portion of the inverting input. The primary winding of the feedback transformer is connected in parallel with the secondary winding of the driver transformer. The voltages induced in the secondary winding of the feedback transformer are capacitively coupled to an R.C. filter. The filtered signal from this R.C. filter constitutes the A.C. feedback portion of the inverting input to the operational amplifier. The R.C. filter in the A.C. feedback circuit prevents the higher frequency signal on the coaxial cable from being included in the inverting input to the operational amplifier. The high frequency R.C. filter provides a relatively high impedance to the high frequency signal carried by the coaxial cable. The inverting input to the operational amplifier causes the signal applied to the coaxial cable to have the wave form, peak to peak voltage and frequency of the noninverting input of the operational amplifier.

It is therefore an object of this invention to provide a driver circuit which can apply signals to a transmission line, the wave form, peak to peak voltage and frequency of which satisfy predetermined criteria notwithstanding varying loads seen by the driver on the transmission line.

BRIEF DESCRIPTION OF THE DRAWING

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
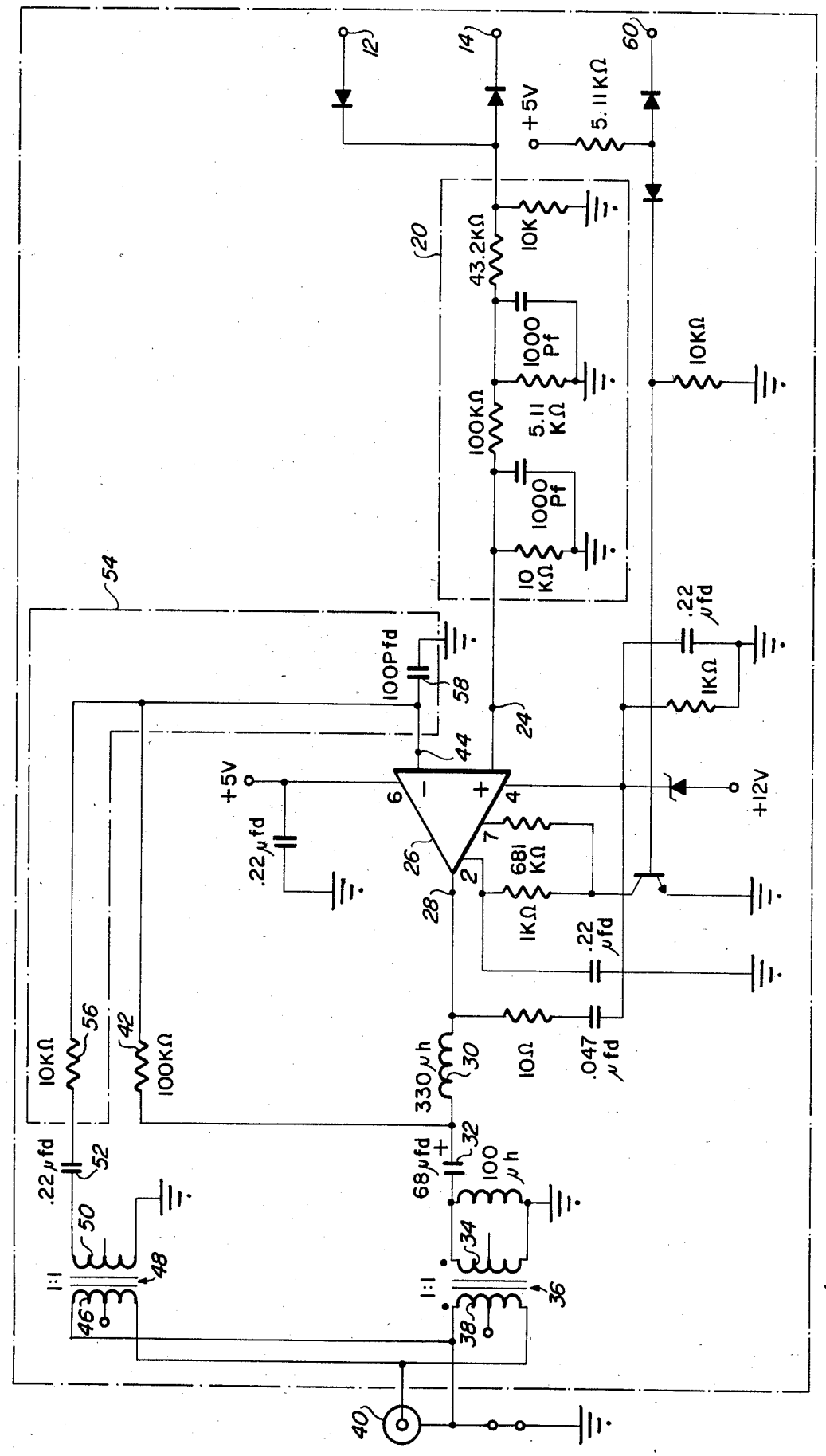
FIG. 1 is a circuit diagram of the driver circuit of the invention.
Figure 2:
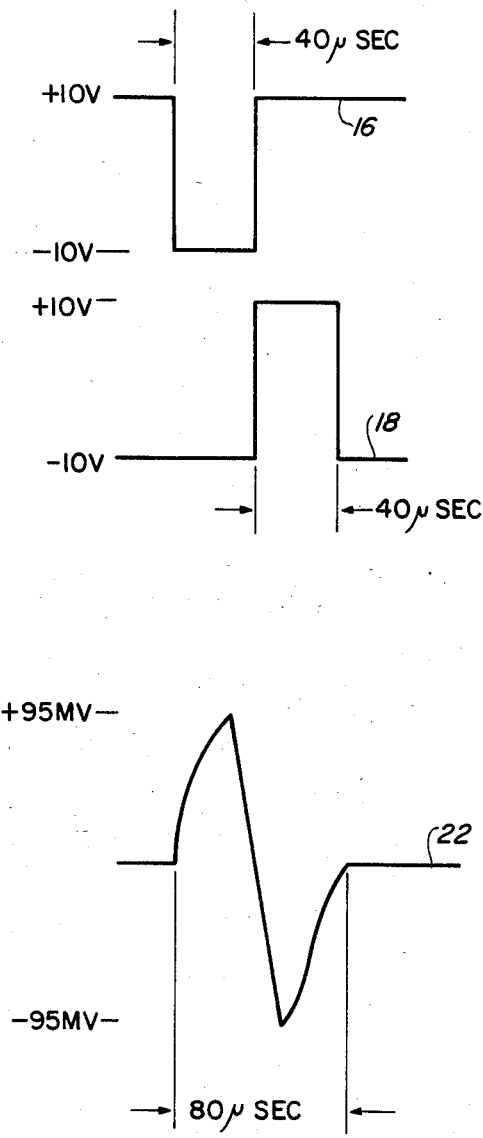
FIG. 2 illustrates wave forms utilized in the description of the invention.

In FIG. 1 driver circuit 10 receives a square wave bipolar signal which is applied to input terminals 12 and 14 from a timing subsystem such as is described in the concurrently filed Kirk application identified above. The wave form, peak to peak voltage and period of this timing signal is as illustrated in FIG. 2 by wave forms 16 and 18. The timing signal applied to terminals 12 and 14 passes through input circuit 20 which attentuates and in addition filters out its higher frequency components to produce a signal having a wave form designated as quasi-sinusoidal with a peak to peak voltage as illustrated in FIG. 2 by wave form 22. The quasi-sinusoidal output of input circuit 20 is connected to the noninverting input terminal 24 of operational amplifier 26. In the preferred embodiment, Op Amp 26 is a National Semiconductor LM13080 programmable power Op Amp. The output of Op Amp 26 at its output terminal 28 is applied through inductor 30 and capacitor 32 across the primary winding 34 of driver coupling transformer 36. Secondary winding 38 of transformer 36 is connected to coaxial cable 40 so that the voltages induced in secondary winding 38 are applied to coaxial cable 40, a transmission line, or local control network bus, of a token passing local area network, for example. The output terminal 28 of Op Amp 26 is also connected through inductor 30 and resistor 42 to the inverting input terminal 44 of Op Amp 26. The circuit including resistor 42 provides a D.C. feedback path to inverting input terminal 44.

To provide an A.C. feedback to inverting terminal 44, the primary winding 46 of feedback transformer 48 is connected in parallel with the secondary winding 38 of transformer 36. The voltages induced across secondary winding 50 of transformer 48 are capacitively coupled through capacitor 52 and RC filter circuit 54 to inverting input terminal 44. Filter circuit 54 includes resistor 56 and capacitor 58.

In the preferred embodiment, cable 40, a substantial percentage of the time, is carrying a high frequency signal having a peak to peak voltage of 800 MV at 5 M Hz. Driver circuit 10 drives a 12.5 K Hz signal having a peak to peak voltage of 95 MV onto cable 40. The wave form of the 12.5 K Hz is quasi-sinusoidal as the result of filtering out the high frequency harmonics of the substantially square wave input signals applied to input terminals 12 and 14 by filter attentuator circuit 20. Circuit 20 also reduces the amplitude of the applied signal to that which is compatible with the system requirements, i.e., a peak to peak voltage at terminal 24 which does not exceed 100 MV in the preferred embodiment.

Inductor 30, which is connected in series with output terminal 28 of Op Amp 26, allows the 12.5 K Hz output signals produced by Op Amp 26 to easily pass through and be applied across the primary windings 34 of driver transformer 36 while offering a high impedance to the 5 M Hz signal on cable 40. Resistor 42 in the D.C. feedback circuit also presents a high impedance to the 5 M Hz signal on cable 40.

In order for driver circuit 10 to drive, or apply, signals onto cable 10, having the same wave form, peak to peak voltage, and frequency as those applied to noninverting input terminal 24 of Op Amp 26, it is necessary that the wave form, peak to peak voltage and frequency of the signal applied to inverting input terminal 44 of Op Amp 26 by the A.C. and D.C. feedback loops, or circuits, be the same as that applied to noninverting terminal 24. It might be assumed that the voltage across primary coil 34 of transformer coil 38 is substantially the same as those induced in the secondary winding 38. Such is not the case since the currents required to drive the many loads seen by secondary winding 38 cause losses in transformer 36 that result in the voltage across primary coil 34 being different from those across secondary coil 38. Thus, the wave form and voltage across winding 34 does not duplicate that across winding 38.

To provide as the A.C. feedback signal, one which duplicates that across winding 38 of driver transformer 36, primary coil 46 of feedback transformer 48 is connected in parallel with coil 38. As a result the wave form and voltage across the secondary winding 50 of feedback transformer 48 is a much more representative signal of that applied to cable 40. When this A.C. feedback signal is combined with the D.C. feedback signal through resistor 42 they cause the output of Op Amp 26 to be such that the wave form, peak to peak voltage, and frequency of the signal applied to cable 40 substantially matches in all respects, or duplicates the noninverting signal applied to terminal 24 of Op Amp 26.

The circuit connected to pin 4 of Op Amp 26 is utilized to stabilize the gain of Op Amp 26. The circuit connected to pins 2 and 7 of Op Amp 26 prevent it from functioning when appropriate signals are applied to pin 6, which signals prevent Op Amp 26 from transmitting during power up and power down.

From the foregoing it is believed obvious that the driver circuit of this invention applies signals to a transmission line, the wave form, peak to peak voltage and frequency of which satisfies predetermined criteria for these signals notwithstanding varying loads on the transmission line as seen by the driver circuit.

It should be evident that various modifications can be made to the described embodiment without departing from the scope of the present invention.

What is claimed is:

1. A driver circuit for applying a quasi-sinusoidal signal having a given peak to peak voltage and frequency to a transmission line comprising:
    a driver transformer having a primary winding and a secondary winding;
    amplifying means having inverting and noninverting input terminals to which said quasi-sinusoidal signal is applied for producing an output signal at an output terminal of the amplifying means, which output signal is applied across the primary winding of the driver transformer;
    a feedback transformer having a primary and a secondary winding;
    circuit means for connecting the secondary winding of a driver transformer in parallel with the primary winding of the feedback transformer and for applying signals induced in the secondary winding of the driver transformer to the transmission line; and
    feedback means for applying signals induced across the secondary winding of the feedback transformer to the inverting input terminal of the amplifying means, whereby the signal applied to the transmission line from the secondary winding of the driver transformer substantially match the signals applied to the noninverting input terminal of the amplifying means.

2. A driver circuit for applying a low frequency quasi-sinusoidal signal having a substantially constant peak to peak voltage and frequency across a transmission line which transmission line concurrently carries higher frequency signals comprising:

operational amplifier means having inverting and noninverting input terminals and an output terminal for producing output signals at its output terminal;

means for applying quasi-sinusoidal signals having a desired peak to peak voltage, waveform, and frequency to the noninverting input terminal of the operational amplifier means;

driver transformer means having a primary and a secondary winding;

first circuit means for applying across the transmission line signals induced in the secondary winding of the driver transformer;

output circuit means including means for providing a high impedance to the high frequency signals present on the transmission line and for applying the output signal of the amplifier means across the primary winding of the driver transformer means;

D.C. circuit feedback means for applying a portion of the output signals of the amplifier means to the inverting input terminal of the amplifier means; and A.C. feedback means including a feedback transformer including a primary and a secondary winding, the primary winding of the feedback transformer being connected in parallel with the secondary winding of the driver transformer, said A.C. feedback means applying a portion of signals induced in the secondary winding of the feedback transformer to the inverting input terminal of the amplifier means, whereby, the signals applied to the transmission line by the driver transformer substantially match those applied to the noninverting input terminal of the amplifier.

3. A driver circuit comprising:

an amplifier having an inverting and a noninverting input terminal and an output terminal;

an input circuit including an input terminal, an output terminal, and R.C. filters, said input circuit adapted to have applied to it substantially square wave signals having a given frequency and peak to peak voltage, the output terminal of the input circuit being connected to the noninverting input terminal of the amplifier;

an isolation circuit including an inductor having an input terminal and an output terminal, the input terminal of the isolation circuit being connected to the output terminal of the amplifier;

a driver transformer having a primary and a secondary winding;

first circuit means connecting the output terminal of the isolation circuit to the primary coil of the driver transformer;

a transmission line;

second circuit means for connecting the transmission line with the secondary winding of the driver transformer so that the signals induced in the secondary winding of the driver transformer are applied to the transmission line;

a D.C. feedback circuit connected between the output terminal of the isolation circuit and the inverting input terminal of the amplifier;

a feedback transformer having a primary and a secondary winding;

third circuit means for connecting the primary winding of the feedback transformer in parallel with the secondary winding of the driver transformer; and an A.C. feedback circuit capacitively coupled to the secondary winding of the feedback transformer and connected to the inverting input terminal of the amplifier, the characteristics of the A.C. and D.C. feedback circuits causing the signal applied to the inverting input terminal of the amplifier to substantially match those applied to the noninverting input terminal of the amplifier by the input circuit.

4. A driver circuit for applying low frequency substantially constant peak to peak voltage signals to a transmissin line concurrently carrying a high frequency signal, comprising:

amplifier means having inverting and noninverting input terminals and an output terminal;

input circuit means to which is applied bipolar square wave signals having a peak to peak voltage of substantially 10 volts and a frequency of substantially 12.5 K Hz, and for applying 100 millivolt (mv) quasi-sinusoidal signal having a frequency of substantially 12.5 K Hz to the noninverting input terminal of the amplifier;

an isolation circuit having an input terminal and an output terminal, the input terminal being connected to the output terminal of the amplifier;

a driver transformer having a primary and a secondary winding;

first circuit means for connecting the output terminal of the isolation circuit to the primary winding of the driver transformer;

second circuit means for connecting the secondary winding of the driver transformer to the transmission line;

a D.C. feedback circuit connecting the output terminal of the isolation circuit to the inverting input terminal of the amplifier; and an A.C. feedback circuit including a feedback transformer having a primary and a secondary winding, the primary winding of the feedback transformer being connected in parallel with the secondary winding of the driver transformer, said A.C. feedback circuit applying a portion of the signals induced in the secondary winding of the feedback transformer to the inverting input terminal of the amplifier, whereby the signals applied to the transmission line by the driver circuit substantially match those applied to the noninverting input terminal of the amplifier.

5. The driver circuit of claim 4 in which the A.C. feedback circuit further includes an R.C. filter for removing said high frequency signals from the A.C. feedback signal.

* * * * *